(12) United States Patent
Lian

(10) Patent No.: US 8,877,625 B1
(45) Date of Patent: Nov. 4, 2014

(54) METHODS OF FORMING SEMICONDUCTOR DEVICES WITH DIFFERENT INSULATION THICKNESS ON THE SAME SEMICONDUCTOR SUBSTRATE AND THE RESULTING DEVICES

(71) Applicant: GLOBALFOUNDRIES Inc., Grand Cayman (KY)

(72) Inventor: Jun Lian, Mechanicville, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 13/893,955

(22) Filed: May 14, 2013

(51) Int. Cl.
 *H01L 29/40* (2006.01)
 *H01L 21/8234* (2006.01)
 *H01L 29/423* (2006.01)
 *H01L 27/088* (2006.01)

(52) U.S. Cl.
 CPC .. *H01L 21/823462* (2013.01); *H01L 29/42364* (2013.01); *H01L 27/088* (2013.01)
 USPC .............................. 438/591; 438/216; 257/327

(58) Field of Classification Search
 CPC ...................... H01L 21/823842; H01L 29/517; H01L 21/32139; H01L 29/66545; H01L 21/28088; H01L 21/823857
 USPC .......... 257/382, 288, 401, E29.267, E29.299; 438/216
 See application file for complete search history.

(56) References Cited

U.S. PATENT DOCUMENTS

2013/0244414 A1* 9/2013 Song et al. ............... 438/591

* cited by examiner

*Primary Examiner* — Zandra Smith
*Assistant Examiner* — Paul Patton
(74) *Attorney, Agent, or Firm* — Amerson Law Firm, PLLC

(57) ABSTRACT

One method includes forming first and second devices by forming a first layer of gate insulation material having a first thickness for the first device, forming a layer of high-k insulation material having a second thickness that is less than the first thickness for the second device and forming first and second metal-containing gate electrode structures that contact the first layer of gate insulation material and the high-k insulation material. A device disclosed herein includes first and second semiconductor devices wherein the first gate structure comprises a layer of insulating material having a first portion of a first metal layer positioned on and in contact with the layer of insulating material and a second gate structure comprised of a layer of high-k insulation material and a second portion of the first metal layer positioned on and in contact with the layer of high-k insulation material.

21 Claims, 9 Drawing Sheets

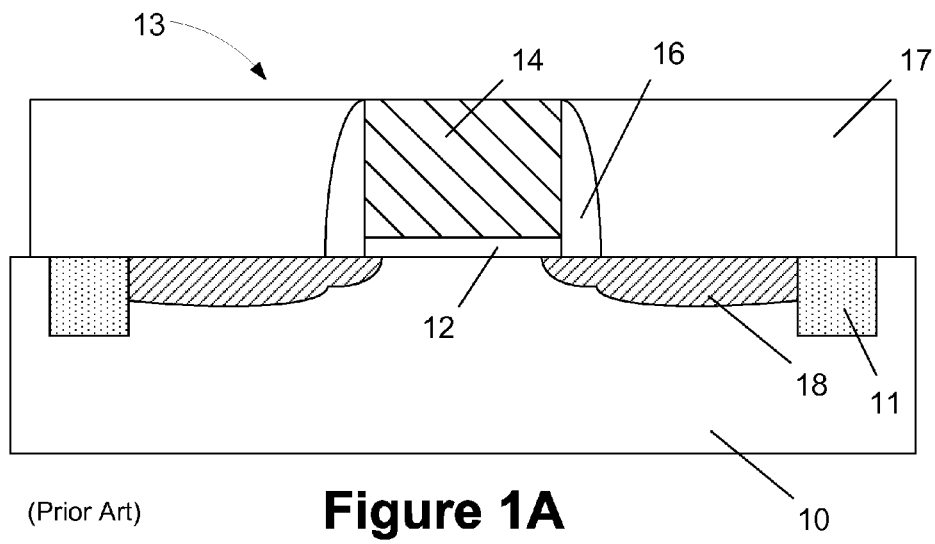
(Prior Art) Figure 1A
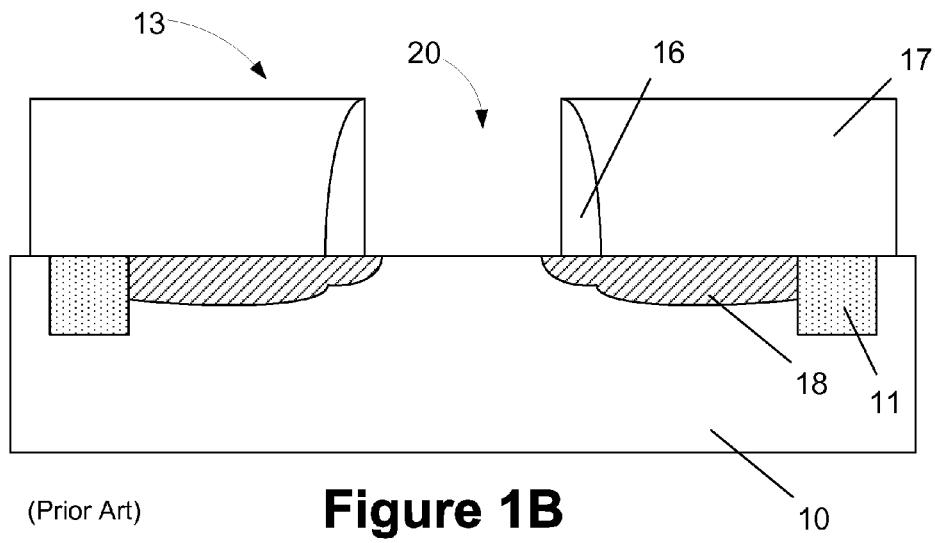
(Prior Art) Figure 1B

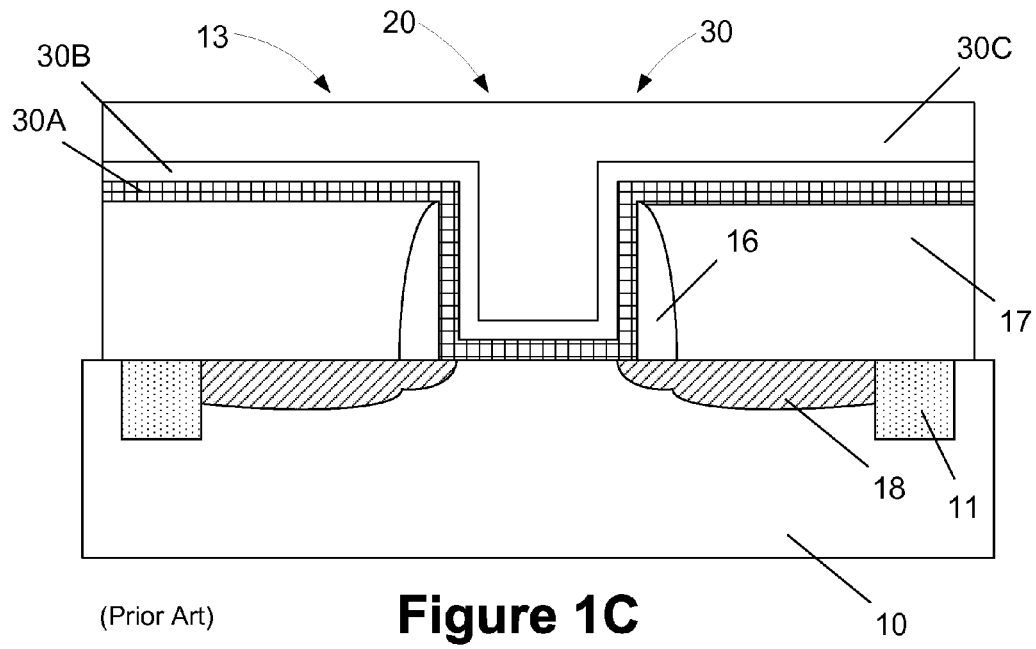
(Prior Art) Figure 1C
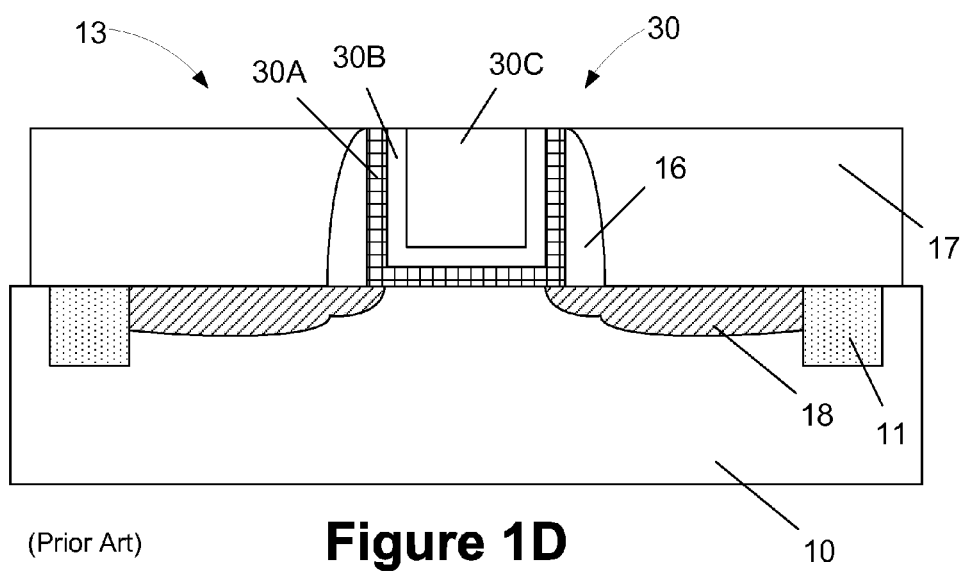
(Prior Art) Figure 1D

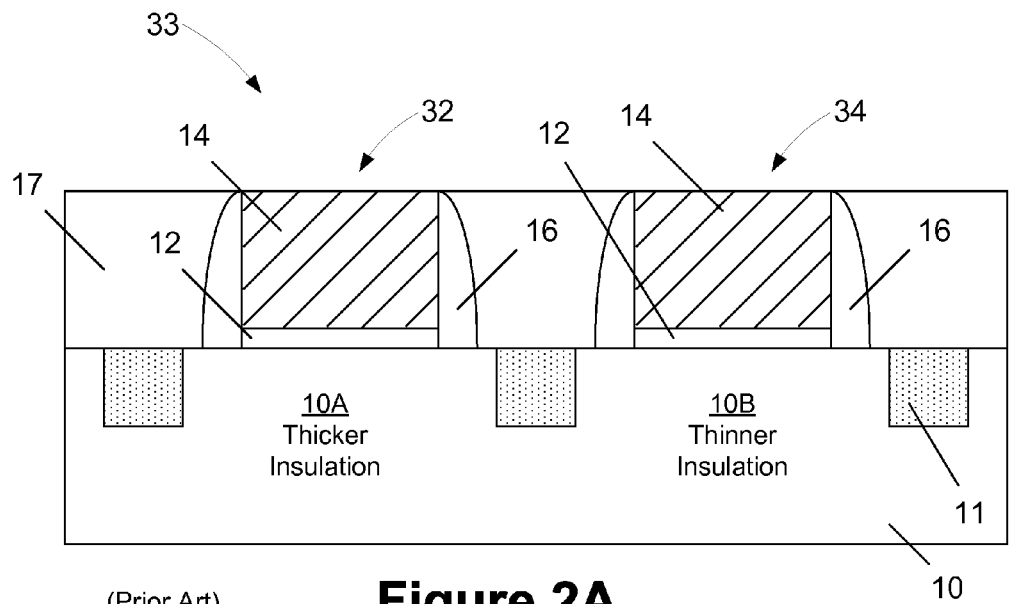
(Prior Art) Figure 2A
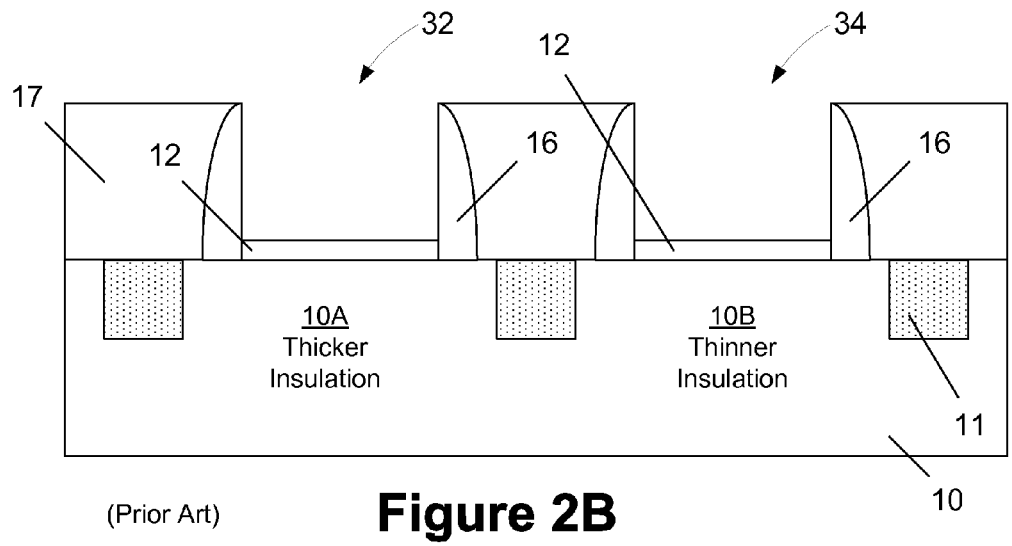
(Prior Art) Figure 2B

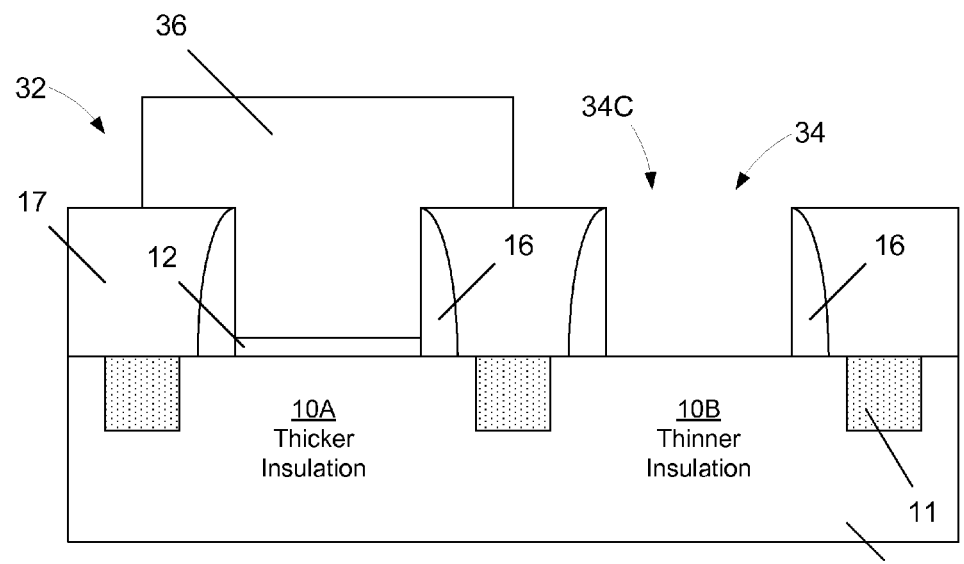
(Prior Art) Figure 2C
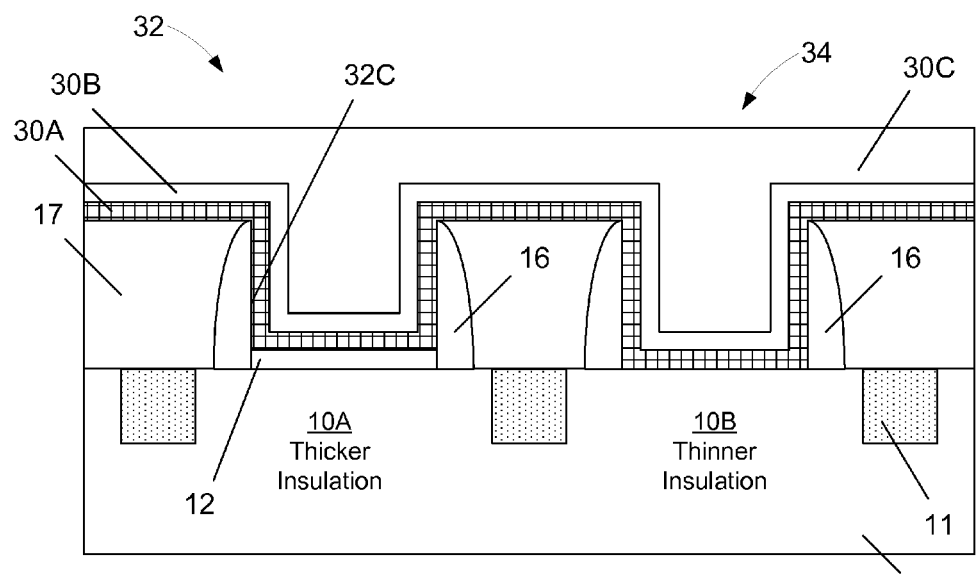
(Prior Art) Figure 2D

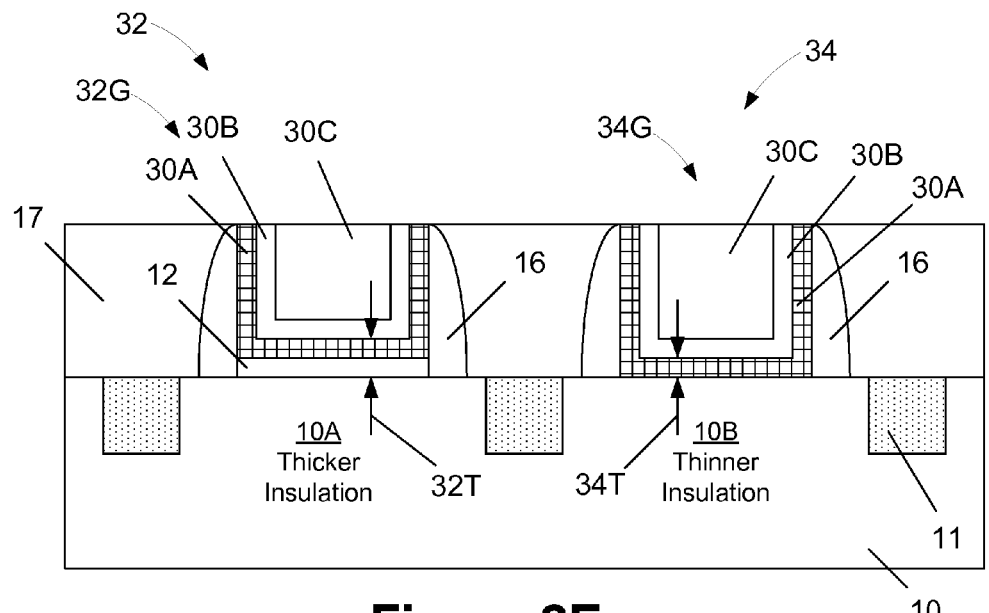
(Prior Art) Figure 2E
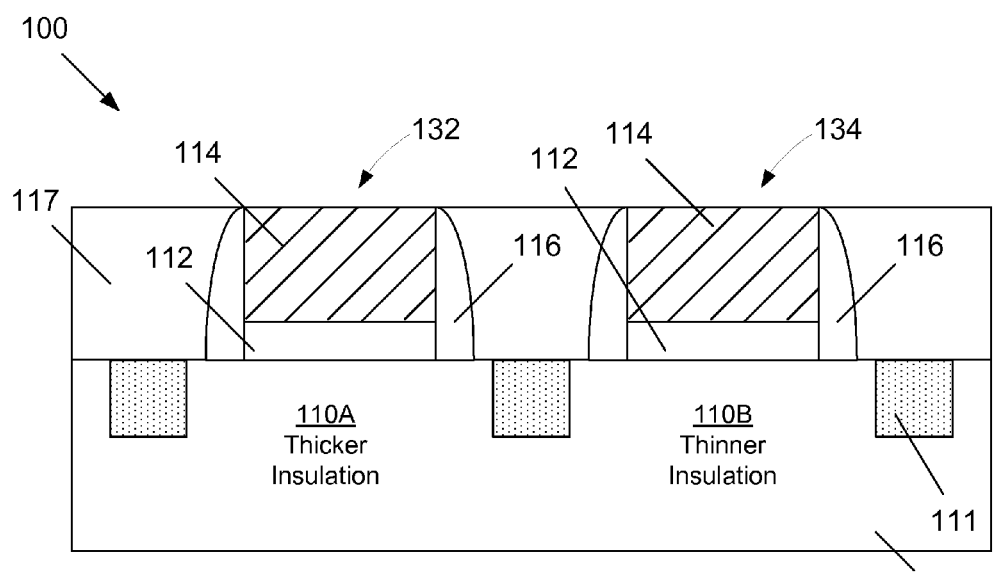
Figure 3A

METHODS OF FORMING SEMICONDUCTOR DEVICES WITH DIFFERENT INSULATION THICKNESS ON THE SAME SEMICONDUCTOR SUBSTRATE AND THE RESULTING DEVICES

BACKGROUND OF THE INVENTION

1. Field of the Invention

Generally, the present disclosure relates to the manufacture of semiconductor devices, and, more specifically, to various methods of manufacturing semiconductor devices with different insulation thicknesses on the same semiconductor substrate and the resulting integrated circuit products.

2. Description of the Related Art

The fabrication of advanced integrated circuits, such as CPU's, storage devices, ASIC's (application specific integrated circuits) and the like, requires the formation of a large number of circuit elements in a given chip area according to a specified circuit layout, wherein field effect transistors (NFET and PFET transistors) represent one important type of circuit element used in manufacturing such integrated circuit devices. A field effect transistor, irrespective of whether an NFET transistor or a PFET transistor is considered, typically comprises doped source and drain regions that are formed in a semiconducting substrate that are separated by a channel region. A gate insulation layer is positioned above the channel region and a conductive gate electrode is positioned above the gate insulation layer. By applying an appropriate voltage to the gate electrode, the channel region becomes conductive and current is allowed to flow from the source region to the drain region.

For many early device technology generations, the gate electrode structures of most transistor elements have comprised a plurality of silicon-based materials, such as a silicon dioxide and/or silicon oxynitride gate insulation layer, in combination with a polysilicon gate electrode. However, as the channel length of aggressively scaled transistor elements has become increasingly smaller, many newer generation devices employ gate electrode stacks comprising alternative materials in an effort to avoid the so-called short-channel effects which may be associated with the use of traditional silicon-based materials in reduced channel length transistors. For example, some gate electrode structures are comprised of a so-called high-k dielectric layer (k value greater than 10) and one or more metals layers that act as the gate electrode or as a work-function adjusting material, i.e., a high-k/metal gate (HK/MG) configuration. Such high-k/metal gate structures have been shown to provide significantly enhanced operational characteristics over the heretofore more commonly used silicon dioxide/polysilicon (SiO/poly) configurations. These metal gate electrode materials may include, for example, one or more layers of titanium (Ti), titanium nitride (TiN), titanium-aluminum (TiAl), aluminum (Al), aluminum nitride (AlN), tantalum (Ta), tantalum nitride (TaN), tantalum carbide (TaC), tantalum carbonitride (TaCN), tantalum silicon nitride (TaSiN), tantalum silicide (TaSi) and the like.

One well-known processing method that has been used for forming a transistor with a high-k/metal gate structure is the so-called "gate last" or "replacement gate" technique. FIGS. 1A-1D depict one illustrative prior art method for forming an HK/MG replacement gate structure using a gate last technique. As shown in FIG. 1A, the process includes the formation of a basic transistor structure 13 above a semiconducting substrate 10 in an active area defined by a shallow trench isolation structure 11. At the point of fabrication depicted in FIG. 1A, the device 13 includes a dummy or sacrificial gate insulation layer 12, a dummy or sacrificial gate electrode 14, sidewall spacers 16, a layer of insulating material 17 and source/drain regions 18 formed in the substrate 10. The various components and structures of the device 13 may be formed using a variety of different materials and by performing a variety of known techniques. For example, the sacrificial gate insulation layer 12 may be comprised of silicon dioxide, the sacrificial gate electrode 14 may be comprised of polysilicon, the sidewall spacers 16 may be comprised of silicon nitride and the layer of insulating material 17 may be comprised of silicon dioxide. The source/drain regions 18 may be comprised of implanted dopant materials (N-type dopants for NFET devices and P-type dopants for PFET devices) that are implanted into the substrate 10 using known masking and ion implantation techniques. Of course, those skilled in the art will recognize that there are other features of the transistor 13 that are not depicted in the drawings for purposes of clarity. For example, so-called halo implant regions are not depicted in the drawings, as well as various layers or regions of silicon/germanium that are typically found in high-performance PFET transistors. At the point of fabrication depicted in FIG. 1A, the various structures of the device 13 have been formed and a chemical mechanical polishing process (CMP) has been performed to remove any materials above the sacrificial gate electrode 14 (such as a protective cap layer (not shown) comprised of silicon nitride) so that the sacrificial gate electrode 14 may be removed.

As shown in FIG. 1B, one or more etching processes are performed to remove the sacrificial gate electrode 14 and the sacrificial gate insulation layer 12 to thereby define a gate opening or cavity 20 where a replacement gate structure will subsequently be formed.

Typically, the sacrificial gate insulation layer 12 is removed as part of the replacement gate technique, as depicted herein. However, the sacrificial gate insulation layer 12 may not be removed in all applications. Even in the case where the sacrificial gate insulation layer 12 is removed, a very thin interfacial layer of silicon dioxide (not shown) will typically form on the substrate 10 within the gate cavity 20.

Next, as shown in FIG. 1C, various layers of material that will constitute part of the replacement gate structure 30 are formed in the gate cavity 20. In one illustrative example, the replacement gate structure 30 is comprised of a high-k gate insulation layer 30A having a thickness of approximately 2 nm, a work function adjusting layer 30B comprised of a metal (e.g., a layer of titanium nitride with a thickness of 2-5 nm) and a bulk metal layer 30C (e.g., aluminum, tungsten, etc.). Ultimately, as shown in FIG. 1D, one or more chemical mechanical polishing (CMP) processes are performed to remove excess portions of the gate insulation layer 30A, the work function adjusting layer 30B and the bulk metal layer 30C positioned outside of the gate cavity 20 to define the replacement gate structure 30.

In some situations, integrated circuit products are formed with semiconductor devices, such as transistors, that have different gate insulation thicknesses. For example, input/output circuits may be formed using transistors having thicker gate insulation layers, as compared to logic circuits or SRAM cells that are formed using transistor devices having relatively thinner gate insulation layers. In general, all other things being equal, the thinner the gate insulation layer of a transistor device, the faster will be its switching speed. Thus, transistor devices with very thin gate insulation layers are used in the circuits that demand higher performance, e.g., faster switching speeds. However, such increased performance in a transistor is not without "costs," as, all other things being equal, transistor devices with relatively thinner gate insulation layers tend to exhibit greater "leakage," i.e., off-state leakage currents, as compared to transistor devices with relatively thicker gate insulation layers. As a net result, circuits made with transistor devices having relatively thinner gate insulation layers tend to consume more power than circuits made with corresponding transistors having thicker gate insulation layers. Excess power consumption is particularly problematic for integrated circuit products that are intended for use in mobile applications, such as, for example, cell phones and laptops, as reducing the power consumed by the integrated circuit product during operation is very important due to the limited battery life of the device. Thus, in some cases, integrated circuit products may use high-speed (thin gate insulation) transistor devices only where the higher performance they provide is absolutely needed, and use transistor devices (with relatively thicker gate insulation layers) on some or all of the other circuits in the device to reduce the overall power consumed by the consumer product during operation. Another situation where an integrated circuit product may be formed with devices having different gate insulation thicknesses is where the various circuits on the integrated circuit product, i.e., the chip, operate at different voltage levels, which is a relatively common situation in many modern integrated circuit products. Typically, all other things being equal, the transistor devices that will be subjected to a higher operating voltage will have a thicker gate insulation layer as compared to transistor device that will be subjected to a lower operating voltage.

FIGS. 2A-2E depict one illustrative prior art method of forming an integrated circuit product 33 comprised of transistor devices 32, 34 having different gate insulation thicknesses using a replacement gate process. As shown in FIG. 2A, a first transistor 32 that is intended to have a relatively thicker final gate insulation layer will be formed in and above an active region 10A that is defined in the substrate 10 via the illustrative isolation regions 11. Also depicted in FIG. 2A is a second transistor 34 that is intended to have a relatively thinner final gate insulation layer than that of the first transistor 32. The second transistor 34 will be formed in and above an active region 10B that is defined in the substrate 10 via the illustrative isolation regions 11. At the point of fabrication depicted in FIG. 2A, the various structures of the device 33 have been formed and a chemical mechanical polishing process (CMP) has been performed to remove any materials above the sacrificial gate electrode 14 (such as a protective cap layer (not shown) comprised of silicon nitride) so that the sacrificial gate electrode 14 may be removed.

As shown in FIG. 2B, one or more etching processes have been performed to remove the sacrificial gate electrode 14 of both of the devices 32, 34. After the sacrificial gate electrode 14 is removed, the sacrificial gate insulation layer 12 remains in place in both of the devices 32, 34. However, as described more fully below, the gate insulation layer 12 will be part of the overall final gate insulation for the device 32, i.e., the gate insulation layer 12 is not sacrificial in nature as it relates to the device 32 that will ultimately have a relatively thicker overall stack of gate insulation material as compared to the device 34. Thus, the thickness of the gate insulation layer 12 is typically selected to be the desired thickness of the silicon dioxide portion of the final stack of gate insulation material that will be formed for the device 32, with the allowance for additional high-k insulating material that will be formed above the layer 12 for the device 32, as described more fully below. The final stack of gate insulation material for the device 32 will include the layer of gate insulation material 12 and the to-be-formed layer of high-k insulating material. For example, in one embodiment, the layer of insulation material 12 may be a layer of silicon dioxide having a thickness of about 3-5 nm.

FIG. 2C depicts the device after several process operations have been performed. First, a patterned etch mask 36, e.g., a patterned photoresist mask, was formed above the substrate 10 using known photolithography tools and equipment. The patterned etch mask 36 covers the device 32 but exposes the device 34 for further processing. Next, an etching process was performed through the patterned etch mask 36 to remove the sacrificial gate insulation layer 12 on the exposed device 34 so as to thereby define a gate cavity 34C where a replacement gate structure will subsequently be formed for the device 34. As noted above, when the sacrificial gate insulation layer 12 is removed, a very thin interfacial layer of silicon dioxide (not shown) will typically form on the substrate 10 within the gate cavity 34C.

FIG. 2D depicts the device after several process operations have been performed. First, the patterned etch mask 36 was removed. This results in a gate cavity 32C for the device 32, i.e., the space between the spacers 16 and above the remaining original gate insulation layer 12. Thereafter the various layers of material that will be part of the final replacements gate structures 32G, 34G are formed in the gate cavities 32C, 34C. In one illustrative example, this involves formation of the above-described high-k gate insulation layer 30A, work function adjusting layer 30B and bulk metal layer 30C (e.g., aluminum, tungsten, etc.). Ultimately, as shown in FIG. 2E, one or more chemical mechanical polishing (CMP) processes are performed to remove excess portions of the gate insulation layer 30A, the work function adjusting layer 30B and the bulk metal layer 30C positioned outside of the gate cavities 32C, 34C to define the replacement gate structures 32G, 34G, respectively. As depicted, the device 32 has a greater thickness 32T of gate insulation materials (the gate insulation layer 12 plus the high-k gate insulation layer 30A) as compared to the thickness 34T of the device 34, which only has the high-k gate insulation layer 30A. To the extent that an interfacial layer is present on the device 34, it would be considered to be part of this overall thickness of gate insulation material. However, even if such an interfacial layer were present, it is so thin that, even when considered to be combined with the high-k gate insulation layer 30A, the device 34 would still have a lesser thickness of gate insulation material as compared to the device 32.

The present disclosure is directed to various methods of manufacturing semiconductor devices with different insulation thicknesses on the same semiconductor substrate and the resulting integrated circuit products.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of manufacturing semiconductor devices with different insulation thicknesses on the same semiconductor substrate and the resulting integrated circuit products. In one example, the method includes forming first and second semiconductor devices above a common semiconductor substrate by forming a first layer of gate insulation material above the substrate at least at a location where a channel region of the first semiconductor device will be formed, wherein the first layer of gate insulation material is formed to a first substantially uniform thickness, forming a first patterned mask layer that covers the first semiconductor device but exposes the second semiconductor device for further processing, with the patterned mask layer in position, forming a layer of high-k insulation material above the substrate where a channel region of the second semiconductor device will be formed, wherein the layer of high-k insulation material is formed to a second substantially uniform thickness that is less than the first uniform thickness of the first layer of gate insulation material, removing the patterned mask layer, and performing at least one common process operation to form a first metal-containing gate electrode structure for the first semiconductor device and a second metal-containing gate electrode structure for the second semiconductor device, wherein a portion of the first metal-containing gate electrode structure is formed on and in contact with the first layer of gate insulation material and a portion of the second metal-containing gate electrode structure is formed on and in contact with the high-k insulation material.

Another illustrative method of forming first and second semiconductor devices above a common semiconductor substrate includes forming a first layer of gate insulation material above the substrate at locations where channel regions of the first and second semiconductor devices will be formed, wherein the first layer of gate insulation material is formed to a first substantially uniform thickness, and forming a first patterned mask layer that covers the first semiconductor device but exposes the second semiconductor device for further processing. In this example, the method also includes, with the patterned mask layer in position, removing a portion of the first layer of gate insulation material from above the location where the second channel region will be formed so as to thereby expose a portion of the substrate and forming a layer of high-k insulation material above the exposed portion of the substrate, wherein the layer of high-k insulation material is formed to a second substantially uniform thickness that is less than the first uniform thickness of the first layer of gate insulation material. The method concludes with the step of removing the patterned mask layer and performing at least one common process operation to form a first metal-containing gate electrode structure for the first semiconductor device and a second metal-containing gate electrode structure for the second semiconductor device, wherein a portion of the first metal-containing gate electrode structure is formed on and in contact with the first layer of gate insulation material and a portion of the second metal-containing gate electrode structure is formed on and in contact with the high-k insulation material.

Yet another method disclosed herein for forming first and second semiconductor devices above a common semiconductor substrate includes forming first and second gate structures above the substrate, wherein each of the first and second gate structures are each positioned between spaced-apart spacers and wherein each of the first and second gate structures comprises a first layer of gate insulation material positioned above the substrate and a sacrificial gate electrode material positioned above the first layer of insulating material, forming a first patterned mask layer that covers the first device but exposes the second device for further processing, and performing at least one first etching process through the first patterned mask layer to remove the second gate structure while the first gate structure is masked, wherein the etching process results in a gate cavity for the second semiconductor device wherein a portion of the substrate is exposed. In this embodiment, the method further includes the steps of, with the first patterned mask layer in position, forming a layer of high-k insulation material in the gate cavity of the second semiconductor device and above the first patterned mask layer, performing at least one process operation to remove the first patterned mask layer and portions of the layer of high-k insulation material positioned outside of the gate cavity of the second semiconductor device so as to thereby define a high-k gate insulation layer for the second device that is positioned above the exposed portion of the substrate, and forming a second patterned mask layer that covers the second device but exposes the first device for further processing. In this particular example, the method also includes the steps of performing at least one second etching process through the second patterned mask layer to remove the sacrificial gate electrode of the first gate structure while the second device is masked, wherein the etching process results in a gate cavity for the first semiconductor device that is positioned above the first layer of gate insulation material, and performing at least one common process operation to form a first metal-containing gate electrode structure for the first semiconductor device and a second metal-containing gate electrode structure for the second semiconductor device, wherein a portion of the first metal-containing gate electrode structure is formed on and in contact with the first layer of gate insulation material and a portion of the second metal-containing gate electrode structure is formed on and in contact with the high-k insulation material.

One illustrative embodiment of a device disclosed herein includes a first semiconductor device formed in and above a semiconductor substrate, wherein the first semiconductor device has a first gate structure comprised of a layer of insulating material having a dielectric constant less than 7 positioned above the substrate that has a first uniform thickness and a first portion of a first metal layer positioned on and in contact with the layer of insulating material, and a second semiconductor device formed in and above the substrate, wherein the second semiconductor device has a second gate structure comprised of a layer of high-k insulation material positioned above the substrate that has a second substantially uniform thickness that is less than the first uniform thickness of the layer of insulation material and a second portion of the first metal layer positioned on and in contact with the layer of high-k insulation material.

BRIEF DESCRIPTION OF THE DRAWINGS

The disclosure may be understood by reference to the following description taken in conjunction with the accompanying drawings, in which like reference numerals identify like elements, and in which:

FIGS. 1A-1D depict one illustrative prior art process flow for forming a semiconductor device using a replacement gate approach;

FIGS. 2A-2E depict one illustrative prior art process flow for semiconductor devices with different insulation thicknesses on the same semiconductor substrate; and FIGS. 3A-3I depict one illustrative method disclosed herein of forming semiconductor devices with different insulation thicknesses on the same semiconductor substrate, and an illustrative example of a resulting integrated circuit product.

Figure 3B:
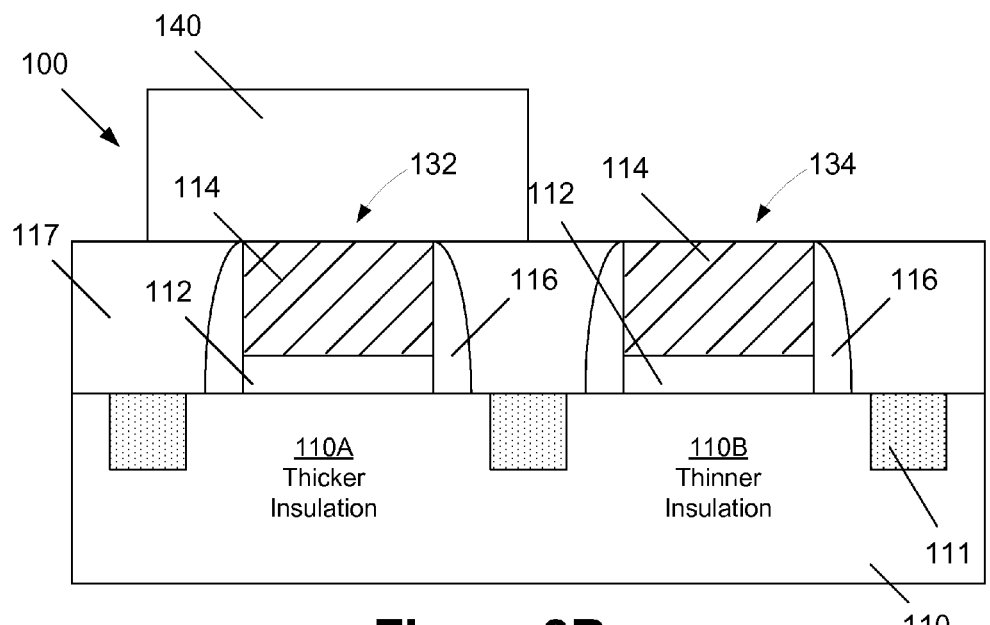

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various methods of manufacturing semiconductor devices with different insulation thicknesses on the same semiconductor substrate and the resulting integrated circuit products. As will be readily apparent to those skilled in the art upon a complete reading of the present application, the present method is applicable to a variety of technologies, e.g., NFET, PFET, CMOS, etc., and is readily applicable to a variety of devices, including, but not limited to, ASICs, logic devices, memory devices, etc. With reference to the attached drawings, various illustrative embodiments of the methods and devices disclosed herein will now be described in more detail.

FIGS. 3A-3I depict one illustrative method disclosed herein of forming semiconductor devices with different insulation thicknesses on the same semiconductor substrate, and an illustrative example of a resulting integrated circuit product 100 that includes such devices. As shown in FIG. 3A, a first transistor 132 that is intended to have a relatively thicker final stack of gate insulation material will be formed in and above an active region 110A that is defined in a semiconductor substrate 110 via the illustrative isolation regions 111. Also depicted in FIG. 3A is a second transistor 134 that is intended to have a relatively thinner final stack of gate insulation material than that of the first transistor 132. The second transistor 134 will be formed in and above an active region 110B that is defined in the substrate 110 via the illustrative isolation regions 111. The substrate 110 may have a variety of configurations, such as a bulk silicon configuration or it may be the active layer of a silicon-on-insulator (SOI) substrate, wherein semiconductor devices are formed in and above the active layer. The substrate 110 may also be made of materials other than silicon. Thus, the terms substrate or semiconductor substrate should be understood to cover all forms of any type of semiconductor material.

The various inventions disclosed herein will be disclosed in the context of forming illustrative planar FET transistor devices having different overall gate insulation thicknesses above a common substrate. However, as will be appreciated by those skilled in the art after a complete reading of the present application, the inventions disclosed herein have broad application. For example, the inventions disclosed herein may be employed in forming FinFET type devices. Thus, the present inventions should not be considered to be limited to any particular type of semiconductor device nor any particular structure.

At the point of fabrication depicted in FIG. 3A, the device 100 includes a gate insulation layer 112, a dummy or sacrificial gate electrode 114, sidewall spacers 116, and a layer of insulating material 117. At this point in the fabrication process, the various components and structures of the device 100 may be formed using a variety of different materials and by performing a variety of known techniques. For example, the gate insulation layer 112 may be comprised of a material having a dielectric constant less than 7, e.g., a layer of silicon dioxide, the sacrificial gate electrode 114 may be comprised of polysilicon, the sidewall spacers 116 may be comprised of silicon nitride and the layer of insulating material 117 may be comprised of silicon dioxide. As discussed more fully below, the gate insulation layer 112 may be formed to a substantially uniform thickness that is approximately equal to a desired final target thickness of the gate insulation material for the device 132. At the point of fabrication depicted in FIG. 3A, the various structures of the device 100 have been formed and a chemical mechanical polishing process (CMP) has been performed to remove any materials above the sacrificial gate electrode 114 (such as a protective cap layer (not shown) comprised of silicon nitride) so that the sacrificial gate electrode 114 may be removed.

FIG. 3B depicts the device 100 after a patterned mask layer 140, e.g., a patterned photoresist mask, was formed above the substrate 110 using known photolithography tools and equipment. The patterned mask layer 140 covers the device 132 but exposes the device 134 for further processing.

Figure 3C:
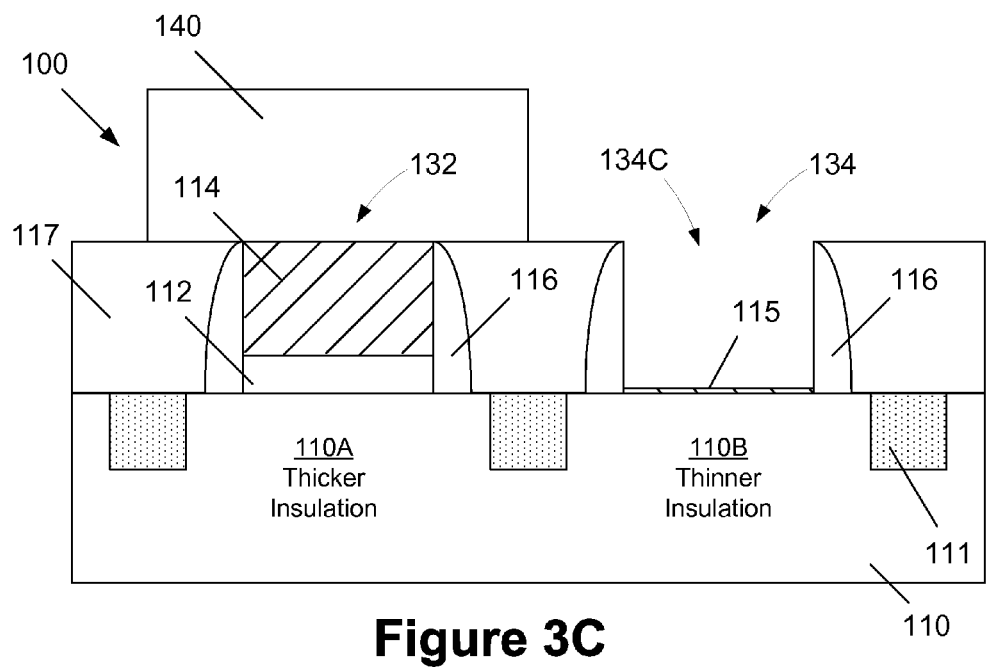

Next, as shown in FIG. 3C, one or more etching processes were performed through the patterned mask layer 140 to remove the sacrificial gate electrode 114 and the gate insulation layer 112 on the exposed device 134 so as to thereby define a gate cavity 134C where a replacement gate structure will subsequently be formed for the device 134. In short, this etching process removes a portion of the gate insulation layer 112 from above the substrate 110 at a location where the channel region of the second device 134 will be formed. It should be noted that, in this example, the sacrificial gate electrode 114 for the device 134 (with the thinner final stack of gate insulation material) is removed while the sacrificial gate electrode 114 for the device 132 (with the thicker final stack of gate insulation materials) is left in place. This is in contrast to the prior art method disclosed in the background section of this application wherein the sacrificial gate electrodes 14 for both devices 32, 34 were removed in a common etching process. See FIG. 2B and associated discussion thereof. As noted above, when the sacrificial gate insulation layer 112 is removed from above the region 110B, a very thin interfacial layer 115 of silicon dioxide may form on the substrate 110 within the gate cavity 134C. So as not to obscure the present invention, the illustrative interfacial layer 115 will not be shown in the subsequent drawings other than FIG. 3I.

Figure 3D:
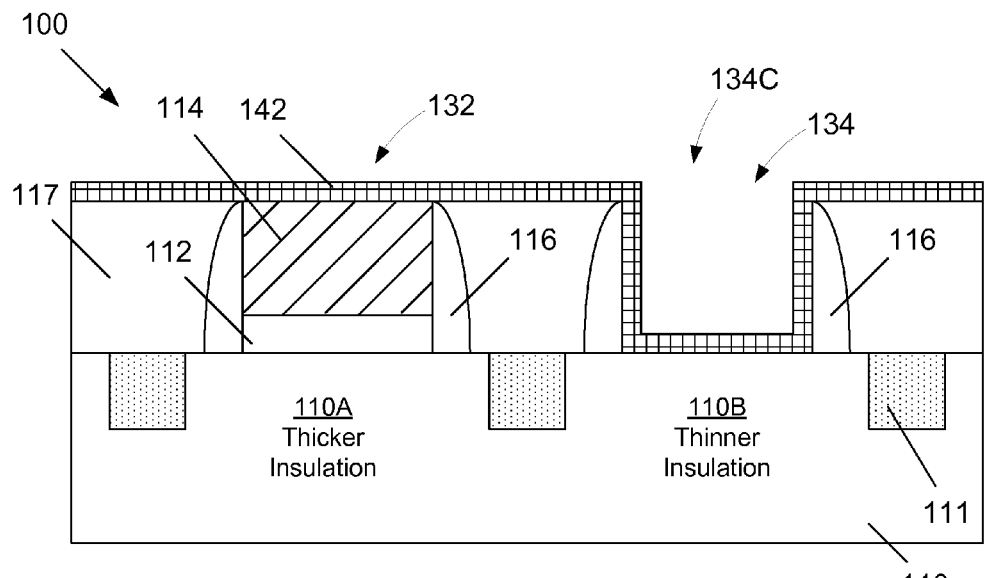

FIG. 3D depicts the device 100 after several process operations have been performed. First, the masking layer 140 was removed using any traditional technique, e.g., ashing. Thereafter, a high-k gate insulation layer 142 is formed above the device and in the gate cavity 134C above the channel region for the second device 134. The high-k gate insulation layer 142 may be comprised of any insulating material having a dielectric constant (k) greater than 10, e.g., hafnium oxide, it has a substantially uniform thickness that may vary depending upon the particular application, e.g., 1-2 nm, and it may be formed by performing a variety of deposition processes, e.g., atomic layer deposition (ALD), chemical vapor deposition (CVD), etc.

Figure 3E:
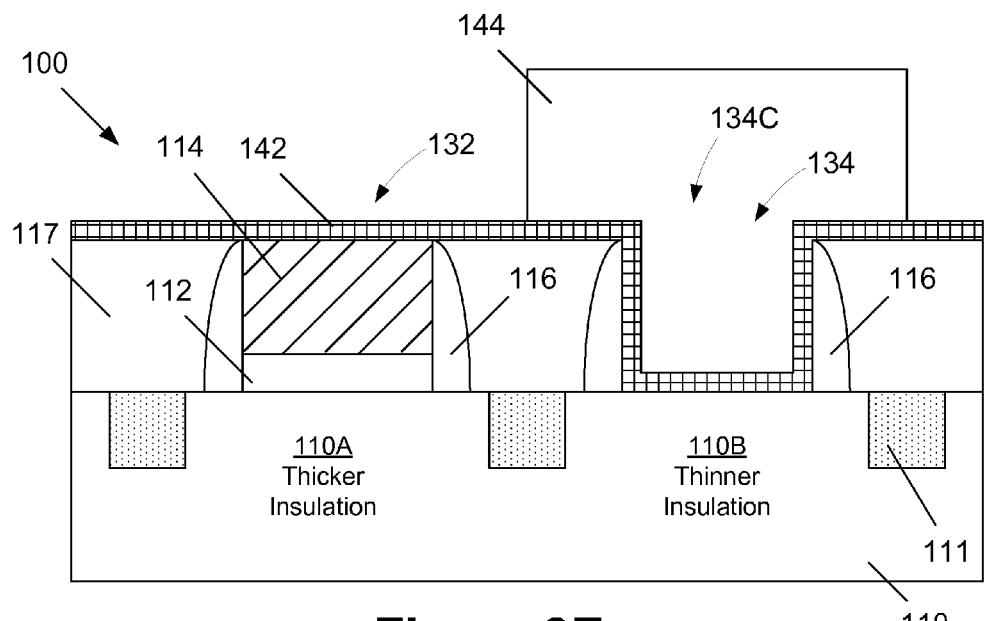

FIG. 3E depicts the device 100 after a patterned mask layer 144, e.g., a patterned photoresist mask, was formed above the substrate 110 using known photolithography tools and equipment. The patterned mask layer 144 covers the device 134 but exposes the device 132 for further processing.

Figure 3F:
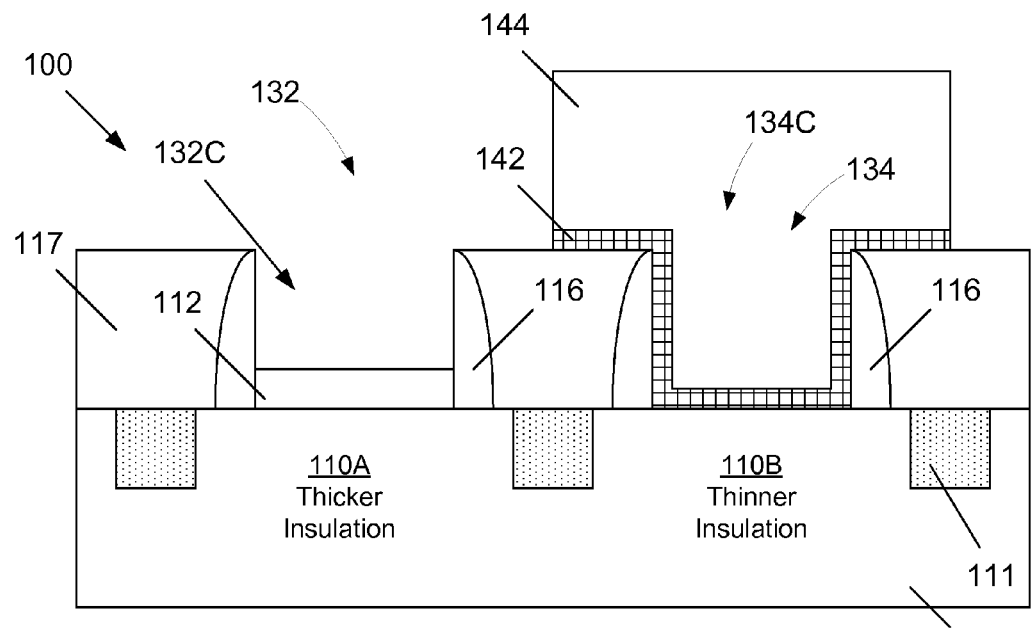

Next, as shown in FIG. 3F, one or more etching processes were performed through the patterned mask layer 144 to remove the exposed portions of the high-k gate insulation layer 142 and the sacrificial gate electrode 114 on the exposed device 132 so as to thereby define a gate cavity 132C (above the original layer of insulating material 112 and between the spacers 116) where a replacement gate structure will subsequently be formed for the device 132.

Figure 3G:
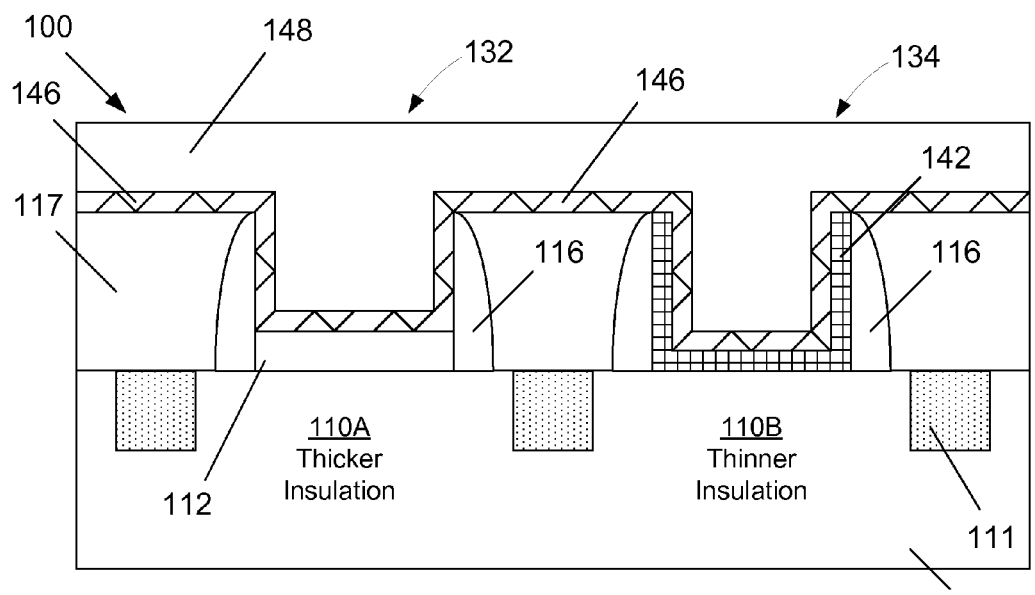

FIG. 3G depicts the device 100 after several processes have been performed. First, the patterned mask layer 144 (see FIG. 3F) was removed by performing, for example, an ashing process. After the patterned mask layer 144 was removed, the various layers of conductive material that will be part of the final replacement gate structures 132G, 134G were formed for the devices 132, 134, respectively, e.g., various metal layers are deposited on the device 100. However, as will be appreciated by those skilled in the art after a complete reading of the present application, such metal layers may include, for example, one or more layers of titanium (Ti), titanium nitride (TiN), titanium-aluminum (TiAl), aluminum (Al), aluminum nitride (AlN), tantalum (Ta), tantalum nitride (TaN), tantalum carbide (TaC), tantalum carbonitride (TaCN), tantalum silicon nitride (TaSiN), tantalum silicide (TaSi) and the like. The layers of metal may be formed by performing a variety of deposition processes, e.g., physical vapor deposition (PVD), atomic layer deposition (ALD), chemical vapor deposition (CVD), etc. In one illustrative example, the methods disclosed herein involve formation of an illustrative work function adjusting metal layer 146 and a bulk metal layer 148 above the device 100. In this example, a common deposition process is performed to form a first portion of the work function adjusting metal layer 146 on and in contact with the original layer of insulating material 112 and form a second portion of the work function adjusting metal layer 146 on and in contact with the high-k gate insulation layer 142.

Figure 3H:
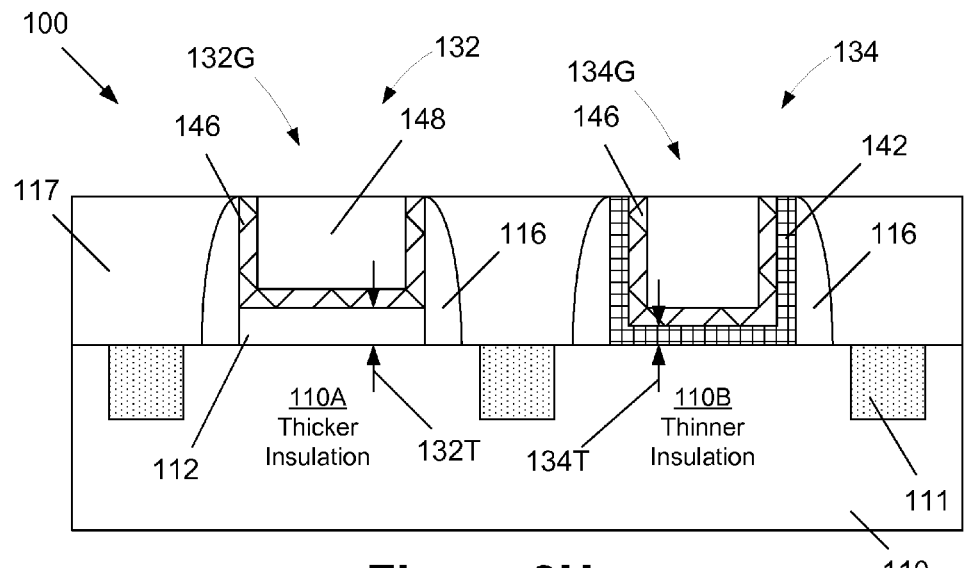

FIG. 3H depicts the device 100 after one or more chemical mechanical polishing (CMP) processes were performed to remove excess portions of the illustrative work function adjusting metal layer 146 and the bulk metal layer 148 positioned outside of the gate cavities 132C, 134C to define the replacement gate structures 132G, 134G, respectively. As depicted, the device 132 has a greater overall thickness 132T of gate insulation materials (the original gate insulation layer 112) as compared to the overall thickness 134T of the high-k gate insulation layer 142 on the device 134. Note that, using the novel methods disclosed herein, the gate insulation material 112 for the device 132—the one with the requirement for relatively thicker gate insulation material—is comprised of the original gate insulation layer 112 (ignoring any interfacial layer that may be present on the device 132). That is, unlike the prior art methods, the high-k gate insulation material layer 142 is not formed as part of the final stack of gate insulation material for the device 132. i.e., the gate insulation layer 112 is initially formed to the final desired target thickness for the device 132 requiring the thicker gate insulation materials. This is, again, in contrast to the prior art method whereby the original gate insulation layer 12 was formed to a thickness that was less than the final desired target thickness of the device 32 to allow room for the placement of additional high-k insulating material 30A above the layer 12.

Figure 3I:
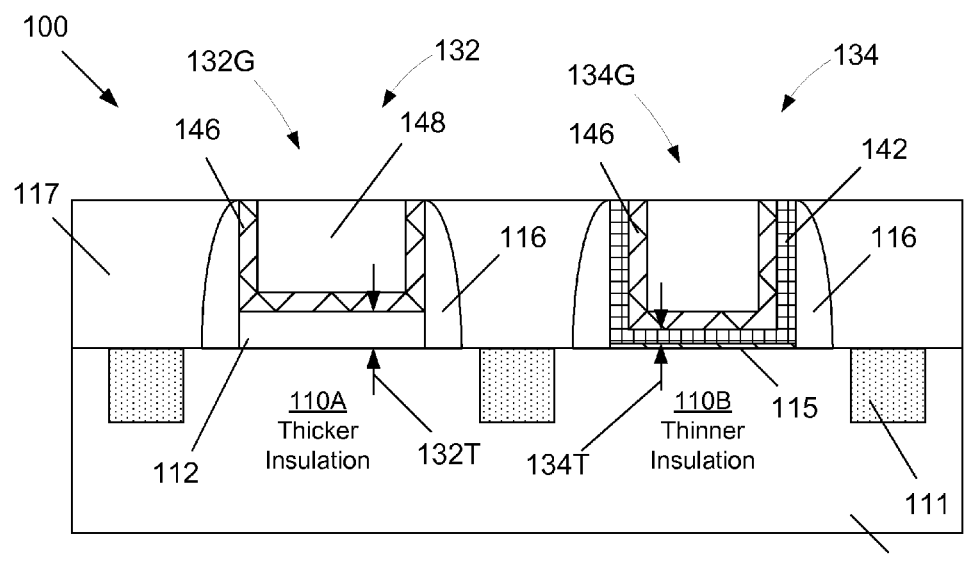

FIG. 3I depicts an example of the device 100 wherein the illustrative interfacial layer 115 is present on the device 134. To the extent that an interfacial layer is present on the device 134, it can be ignored for purposes of determining the overall thickness of gate insulation material for the device. However, even if such an interfacial layer were present, it is so thin (e.g., 0.5 nm) that, even when considered to be combined with the high-k gate insulation layer 142, the device 134 would still have a lesser thickness of gate insulation material as compared to the device 132.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of forming first and second semiconductor devices above a common semiconductor substrate, comprising:

forming a first layer of gate insulation material above said substrate at least at a location where a channel region of said first semiconductor device will be formed, wherein said first layer of gate insulation material is formed to a first substantially uniform thickness;

forming a first patterned mask layer that covers said first semiconductor device but exposes said second semiconductor device for further processing;

with said patterned mask layer in position, forming a layer of high-k insulation material above said substrate where a channel region of said second semiconductor device will be formed, wherein said layer of high-k insulation material is formed to a second substantially uniform thickness that is less than said substantially uniform first thickness of said first layer of gate insulation material;

removing said patterned mask layer; and performing at least one common process operation to form a first metal-containing gate electrode structure for said first semiconductor device and a second metal-containing gate electrode structure for said second semiconductor device, wherein a portion of said first metal-containing gate electrode structure is formed on and in contact with said first layer of gate insulation material and a portion of said second metal-containing gate electrode structure is formed on and in contact with said high-k insulation material.

2. The method of claim 1, wherein performing said at least one common process operation to form a first metal-containing gate electrode structure for said first semiconductor device and a second metal-containing gate electrode structure for said second semiconductor device comprises performing a common metal deposition process to form a work function adjusting metal layer on and in contact with said first layer of gate insulation material and on and in contact with said high-k insulation material.

3. The method of claim 2, further comprising performing at least one additional metal deposition process to form at least one additional layer of metal on said work function adjusting metal layer.

4. The method of claim 1, wherein performing said at least one common process operation to form a first metal-containing gate electrode structure for said first semiconductor device and a second metal-containing gate electrode structure for said second semiconductor device comprises:
   performing a plurality of metal deposition processes to form a plurality of metal layers, wherein one of said plurality of metal layers is formed on and in contact with said first layer of gate insulation material and on and in contact with said high-k insulation material; and
   performing at least one chemical mechanical planarization process.

5. The method of claim 1, wherein said first layer of gate insulation material is comprised of a layer of silicon dioxide.

6. The method of claim 1, wherein said first and second devices are one of planar field-effect transistors or FinFET transistors.

7. A method of forming first and second semiconductor devices above a common semiconductor substrate, comprising:
   forming a first layer of gate insulation material above said substrate at least at locations where channel regions of said first and second semiconductor devices will be formed, wherein said first layer of gate insulation material is formed to a first substantially uniform thickness;
   forming a first patterned mask layer that covers said first semiconductor device but exposes said second semiconductor device for further processing;
   with said patterned mask layer in position:
      removing a portion of said first layer of gate insulation material from above a location where said second channel region will be formed so as to thereby expose a portion of said substrate; and
      forming a layer of high-k insulation material above said exposed portion of said substrate, wherein said layer of high-k insulation material is formed to a second substantially uniform thickness that is less than said first uniform thickness of said first layer of gate insulation material;
   removing said patterned mask layer; and
   performing at least one common process operation to form a first metal-containing gate electrode structure for said first semiconductor device and a second metal-containing gate electrode structure for said second semiconductor device, wherein a portion of said first metal-containing gate electrode structure is formed on and in contact with said first layer of gate insulation material and a portion of said second metal-containing gate electrode structure is formed on and in contact with said high-k insulation material.

8. The method of claim 7, wherein performing said at least one common process operation to form a first metal-containing gate electrode structure for said first semiconductor device and a second metal-containing gate electrode structure for said second semiconductor device comprises performing a common metal deposition process to form a work function adjusting metal layer on and in contact with said first layer of gate insulation material and on and in contact with said high-k insulation material.

9. The method of claim 8, further comprising performing at least one additional metal deposition process to form at least one additional layer of metal on said work function adjusting metal layer.

10. The method of claim 7, wherein performing said at least one common process operation to form a first metal-containing gate electrode structure for said first semiconductor device and a second metal-containing gate electrode structure for said second semiconductor device comprises:
   performing a plurality of metal deposition processes to form a plurality of metal layers, wherein one of said plurality of metal layers is formed on and in contact with said first layer of gate insulation material and on and in contact with said high-k insulation material; and
   performing at least one chemical mechanical planarization process.

11. The method of claim 7, wherein said first layer of gate insulation material is comprised of a layer of silicon dioxide.

12. The method of claim 7, wherein said first and second devices are one of planar field-effect transistors or FinFET transistors.

13. A method of forming first and second semiconductor devices above a common semiconductor substrate, comprising:
   forming first and second gate structures above said substrate, wherein each of said first and second gate structures are each positioned between spaced-apart spacers, and wherein each of said first and second gate structures comprises a first layer of gate insulation material positioned above said substrate and a sacrificial gate electrode material positioned above said first layer of insulating material;
   forming a first patterned mask layer that covers said first device but exposes said second device for further processing;
   performing at least one first etching process through said first patterned mask layer to remove said second gate structure while said first gate structure is masked, said etching process resulting in a gate cavity for said second semiconductor device wherein a portion of said substrate is exposed;
   with said first patterned mask layer in position, forming a layer of high-k insulation material in said gate cavity of said second semiconductor device and above said first patterned mask layer;
   performing at least one process operation to remove said first patterned mask layer and portions of said layer of high-k insulation material positioned outside of said gate cavity of said second semiconductor device so as to thereby define a high-k gate insulation layer for said second device that is positioned above said exposed portion of said substrate;
   forming a second patterned mask layer that covers said second device but exposes said first device for further processing;
   performing at least one second etching process through said second patterned mask layer to remove said sacrificial gate electrode of said first gate structure while said second device is masked, said etching process resulting in a gate cavity for said first semiconductor device that is positioned above said first layer of gate insulation material;
   removing said second patterned mask layer; and
   performing at least one common process operation to form a first metal-containing gate electrode structure for said first semiconductor device and a second metal-containing gate electrode structure for said second semiconductor device, wherein a portion of said first metal-containing gate electrode structure is formed on and in contact with said first layer of gate insulation material and a portion of said second metal-containing gate electrode structure is formed on and in contact with said high-k insulation material.

14. The method of claim 13, wherein performing said at least one common process operation to form a first metal-containing gate electrode structure for said first semiconductor device and a second metal-containing gate electrode structure for said second semiconductor device comprises performing a common metal deposition process to form a work function adjusting metal layer on and in contact with said first layer of gate insulation material and on and in contact with said high-k insulation material.

15. The method of claim 14, further comprising performing at least one additional metal deposition process to form at least one additional layer of metal on said work function adjusting metal layer.

16. The method of claim 13, wherein performing said at least one common process operation to form a first metal-containing gate electrode structure for said first semiconductor device and a second metal-containing gate electrode structure for said second semiconductor device comprises:
performing a plurality of metal deposition processes to form a plurality of metal layers, wherein one of said plurality of metal layers is formed on and in contact with said first layer of gate insulation material and on and in contact with said high-k insulation material; and
performing at least one chemical mechanical planarization process.

17. The method of claim 13, wherein said first layer of gate insulation material is comprised of a layer of silicon dioxide.

18. A device, comprising:
a semiconductor substrate;
a first semiconductor device formed in and above said substrate, said first semiconductor device having a first gate structure comprised of:
a layer of insulating material having a dielectric constant less than 7 positioned above said substrate, said layer of insulating material having a first substantially uniform thickness; and
a first portion of a first metal layer positioned on and in contact with said layer of insulating material; and
a second semiconductor device formed in and above said substrate, said second semiconductor device having a second gate structure comprised of:
a layer of high-k insulation material positioned above said substrate, said layer of high-k insulation material having a second substantially uniform thickness that is less than said first substantially uniform thickness of said layer of insulating material; and
a second portion of said first metal layer positioned on and in contact with said layer of high-k insulation material.

19. The device of claim 18, wherein said layer of insulating material is made of silicon dioxide.

20. The device of claim 18, further comprising an interfacial layer of silicon dioxide positioned between said substrate and said layer of insulating material.

21. The device of claim 18, wherein said first and second semiconductor devices are one of planar field-effect transistors or FinFET transistors.

* * * * *